United States Patent [19]

Ziger

[11] Patent Number: 5,310,457
[45] Date of Patent: May 10, 1994

[54] METHOD OF INTEGRATED CIRCUIT FABRICATION INCLUDING SELECTIVE ETCHING OF SILICON AND SILICON COMPOUNDS

[75] Inventor: David H. Ziger, San Antonio, Tex.

[73] Assignee: AT&T Bell Laboratories, Murray Hill, N.J.

[21] Appl. No.: 954,982

[22] Filed: Sep. 30, 1992

[51] Int. Cl.$^5$ .............................................. H01L 21/00
[52] U.S. Cl. .................................... 156/657; 156/662; 156/654; 156/655; 252/79.1; 252/79.2; 252/79.3
[58] Field of Search ............... 156/662, 657, 654, 655; 252/79.1, 79.2, 79.3

[56] References Cited

PUBLICATIONS

"Etching Patterns In Amorphous Silicon"; J. Vac. Sci. Tech. A, vol. 4, No. 2, Mar.–Apr. 1986; pp. 239–241.
Technology Topics, "Spin Etcher for Removal of Backside Depositions," by Ernst Gaulhofer, May 1991, pp. 57–58, 219.

Primary Examiner—Brian E. Hearn
Assistant Examiner—George Goudreau
Attorney, Agent, or Firm—Richard D. Laumann

[57] ABSTRACT

High etch selectivity of both silicon nitride and silicon with respect to silicon oxide is obtained using an etch bath of phosphoric acid, hydrofluoric acid, and nitric acid. Minimal loading effects are observed and a long bath life is obtained by replenishing the hydroflouric and nitric acids.

7 Claims, No Drawings

METHOD OF INTEGRATED CIRCUIT FABRICATION INCLUDING SELECTIVE ETCHING OF SILICON AND SILICON COMPOUNDS

TECHNICAL FIELD

This invention relates generally to a method for integrated circuit fabrication which utilizes the selective etching of silicon and silicon compounds with respect to silicon oxides and particularly to a method which replenishes and enhances the performance of the etch bath used in such selective etching.

BACKGROUND OF THE INVENTION

Integrated circuit fabrications processes include steps in which materials must be selectively removed with respect to other materials. The removal process may use either wet or dry etching. Regardless of the method selected, the selectivity of the etch between the materials that are removed and those that are not removed should be high. However, selectivity is not the only consideration; the skilled artisan readily appreciates that consistent results over an extended period of time should be readily achieved.

Dielectric regions, termed field oxides, are formed in integrated circuit fabrication by depositing a dielectric mask layer over silicon (likely having a thin oxide, termed a pad oxide, on its surface), patterning the dielectric mask layer to expose the silicon or oxide, and then growing a thick oxide in the exposed region. The thick oxide is the field oxide. The patterned dielectric mask layer is then removed. A typical choice of dielectric for the mask layer is silicon nitride. This process is frequently referred to as LOCOS which is a well known acronym for Localized Oxidation of Silicon. In current practice, a polysilicon layer is frequently present underneath the nitride layer. The patterned structure is referred to as a Poly Buffered LOCOS (PBL) stack. Thus, both silicon nitride and polysilicon must be removed without significant attack on the silicon oxide after the field oxide has been grown.

Wet etching techniques are commonly used for blanket stripping of oxides, nitrides, and silicon. For example, silicon nitrides are etched in boiling phosphoric acid. Minor amounts of nitric acid may also be present in the etch bath. However, these baths are susceptible to aging effects and high particle counts because the silicate concentration in the bath increases with wafer throughput. PBL stacks may be removed with a phosphoric acid/nitric acid bath. However, this bath also suffers from bath aging, presumably due to silicate buildup. The process is also relatively slow with 140 minutes being a representative time for etching a typical PBL stack. Pitting of the oxide can be an additional problem as the polysilicon etches rapidly along its grain boundaries. Some pad oxide may be exposed to the etch bath and may etch (pit) the oxide as etch selectivity between polysilicon and the oxide does not prevent all etching of oxide. Yet another approach strips the nitride in one bath and the polysilicon in another bath. This method also yields some pitting as it is difficult to stop the nitride etch without pitting the polysilicon.

Of course, etching of these materials in other contexts is also contemplated. See, *Solid State Technology*, "Spin Etcher for Removal of Backside Depositions," by Ernst Gaulhofer, May 1991, for a description of etching apparatus and etchants. It is reported that nitric, hydrofluoric, and phosphoric acids are used in a 3:1:1 solution to etch silicon, apparently both single crystal and polycrystalline. No selectivity is reported nor is there any discussion of rejuvenating the etch solution which is important to minimize chemical usage.

Wet etching techniques with high selectivity of nitride and polysilicon with respect to oxide and long bath life are desirable. It will be appreciated that the high selectivity and long bath life should result in higher throughput and lower costs.

SUMMARY OF THE INVENTION

A method of integrated circuit fabrication etches structures having at least one layer of material, which is silicon nitride or silicon, and which is disposed over silicon oxide in a wet bath having phosphoric acid, hydrofluoric acid, and nitric acid. The hydrofluoric and nitric acids are present in relatively small amounts, e.g., typically less than 500 parts per million (ppm) of the bath. The structures are typically patterned and a processing step is performed on the exposed portions of the oxide surface after patterning. The patterned structures are then removed by etching and processing continued. Bath life is extended by replenishment of the hydrofluoric and nitric acid; that is, by adding hydrofluoric and nitric acid.

The bath exhibits relatively constant etch rates as a function of time. It is hypothesized that this feature can be attributed to a reaction between the hydrofluoric acid and the etch products, which leads to reaction products that do not interfere with the rates of the etch chemistry. It is believed that the nitric acid is required to oxidize the silicon.

DETAILED DESCRIPTION

The invention will be described by reference to an exemplary embodiment which etches a silicon nitride/polysilicon stack on an oxide covered silicon surface. Such a stack is used in semiconductor integrated circuit fabrication sequences having poly buffered LOCOS (Local Oxidation of Silicon) to produce a field oxide. This sequence is frequently referred to by the acronym PBL. The fabrication of such a stack is well known to the skilled artisan, but will be briefly summarized. A thin oxide, termed a pad oxide, is formed on the surface of a silicon wafer by a technique such as thermal oxidation. Polysilicon and silicon nitride layers are now sequentially deposited. Appropriate layer thicknesses and deposition conditions will be readily selected. The polysilicon and silicon nitride layers are now patterned, using well-known lithographic processes, to expose selected portions of the oxide covered silicon surface or substrate. The patterning leaves structures which are referred to as PBL stacks. The exposed portions are now subjected to further processing which oxidizes the silicon to form field oxides. Conventional field oxidation processes can be used.

Comments about terminology are appropriate. Silicon nitride and silicon oxide have compositions which are nominally represented as $Si_3N_4$ and $SiO_2$, respectively. The terms silicon oxide and silicon nitride, as used in this specification, refer to not only the stoichiometric compositions but also oxide and nitride compositions which deviate from the stoichiometric compositions. Polysilicon, as used in this specification, may include small regions that may properly be considered amorphous.

After the field oxidation has been completed, the PBL stack must be removed. The wafer having the structures (in the typical integrated circuit fabrication process, many millions of such structures will be present) is now immersed in the etching bath. In the preferred embodiment, the etch bath has phosphoric acid as its primary component and hydrofluoric and nitric acids as minor components. The latter components are desirably present in amounts less than approximately 500 ppm. At these concentrations, selectivities of etching silicon to silicon oxide vary from about 13–50:1. However, higher concentrations of nitric and hydrofluoric acids will yield high silicon etch rates, oxide etch rates will also increase which may make the process difficult to control. The addition of the nitric and hydrofluoric acids increases the polysilicon and silicon nitride etch rates by as much as several orders of magnitude and 100 percent, respectively. At low hydrofluoric acid concentrations, the silicon oxide etch rate remains below 5 angstroms/minute. These results greatly improve the selectivity and decrease the etching time and improve the cycle time. The bath also has minimal loading effects.

The bath has a greatly extended lifetime as compared to baths without hydrofluoric acid due to replenishment of hydrofluoric and nitric acids. That is, HF and HNO$_3$ are added after the bath has been used. Replenishment quantities and times will be readily determined by the skilled artisan. The relevant factors, such as amounts of materials etched, are known to the skilled artisan.

The etch bath desirably has nitric acid present as a minor (compared to phosphoric acid) etch component for etching of the PBL stack. Its highly oxidizing properties have been found to be required for the bath's etching properties.

The chemistry that leads to the improved results is not known with certainty, but the following hypothesis is offered in explanation of the results. The reaction products resulting from the etching of both silicon nitride and polysilicon with phosphoric acid are likely to include silicates which remain in the etch bath. The likely reaction for silicon nitride has a relatively high equilibrium constant and is not practically reversible. However, the likely reactions for both polysilicon and silicon oxide have relatively low equilibrium constants and are practically reversible. The buildup of silicates from any source will prevent the etching of polysilicon from going to completion and result in a significant loading effect. The addition of the hydrofluoric acid to the bath likely results in the effective removal of the silicates from the bath due to a reaction that removes the silicates from the etch chemistry by forming products that do not interfere with the etching of the polysilicon and the silicon nitride. The addition of hydrofluoric acid to the etch bath is directly counter to conventional thought in the art because hydrofluoric acid is a conventional and well-known silicon oxide etchant. It would, accordingly, be expected to increase oxide etching faster than it does polysilicon etching and would be expected to have extremely deleterious effects.

Additionally, the effective removal of the silicates from the etch chemistry means that they cannot form silicate particles. Such particles, as is well known, adversely alter the quality of the bath.

Variations of the embodiment described will be readily apparent to those skilled in the art. For example, only silicon nitride or polysilicon may be present. Also, the silicon may be present as amorphous silicon. Additionally, structures other than a PBL stack may be etched. For example, the silicon in the structure may be single crystal. Furthermore, the structures may be unpatterned, layered structures.

What is claimed is:

1. A method of semiconductor integrated circuit fabrication comprising the steps of:

forming a silicon oxide surface;

forming structures on said, surface said structures comprise layers of both silicon and silicon nitride; and selectively removing said structures relative to said underlying silicon oxide surface by etching in an etch bath comprising phosphoric acid, hydrofluoric acid, and nitric acid.

2. A method as recited in claim 1 comprising the further steps of:

patterning said structures to expose portions of said oxide surface and performing at least one processing step on said exposed oxide surface.

3. A method as recited in claim 2 in which said hydrofluoric acid is present in an amount less than approximately 500 ppm.

4. A method as recited in claim 2 in which said nitric acid is present in an amount less than approximately 500 ppm.

5. A method as recited in claim 1 in which said silicon comprises polysilicon.

6. A method as recited in claim 1 comprising the further step of replenishing said bath by adding at least one member selected from the group consisting of hydrofluoric acid and nitric acid.

7. A method as recited in claim 6 comprising the further step of replenishing the bath by adding nitric acid.

* * * * *